(12) United States Patent
Frye et al.

(10) Patent No.: US 8,558,277 B2
(45) Date of Patent: Oct. 15, 2013

(54) SEMICONDUCTOR DEVICE AND METHOD OF PROVIDING ELECTROSTATIC DISCHARGE PROTECTION FOR INTEGRATED PASSIVE DEVICES

(75) Inventors: Robert C. Frye, Piscataway, NJ (US); Yaojian Lin, Singapore (SG); Rui Huang, Singapore (SG)

(73) Assignee: STATS ChipPAC, Ltd, Singapore (SG)

( * ) Notice: Subject to any disclaimer, the term of this patent is extended or adjusted under 35 U.S.C. 154(b) by 139 days.

(21) Appl. No.: 12/831,047

(22) Filed: Jul. 6, 2010

(65) Prior Publication Data
US 2010/0270549 A1 Oct. 28, 2010

Related U.S. Application Data (62) Division of application No. 12/167,146, filed on Jul. 2, 2008, now Pat. No. 7,772,080.

(51) Int. Cl.
*H01L 29/72* (2006.01)
(52) U.S. Cl.
USPC ........... 257/173; 257/355; 257/528; 257/546; 257/684; 257/737; 257/E29.068; 257/E29.002; 257/E23.141
(58) Field of Classification Search
None
See application file for complete search history.

(56) References Cited

U.S. PATENT DOCUMENTS

| | | | |
|---|---|---|---|
| 5,143,651 A * | 9/1992 | Caffin | 252/519.54 |
| 5,699,035 A | 12/1997 | Ito et al. | |
| 6,700,772 B2 | 3/2004 | Raghavendra et al. | |
| 7,443,267 B2 * | 10/2008 | Saito et al. | 333/172 |
| 7,601,278 B2 * | 10/2009 | Meyer et al. | 252/500 |
| 7,649,435 B2 * | 1/2010 | Moriai et al. | 338/21 |
| 7,741,949 B2 * | 6/2010 | Inoue et al. | 338/21 |
| 2007/0132029 A1 | 6/2007 | Mitra et al. | |
| 2007/0194422 A1 | 8/2007 | Lai et al. | |

* cited by examiner

*Primary Examiner* — Zandra V. Smith
*Assistant Examiner* — Khanh Duong
(74) *Attorney, Agent, or Firm* — Robert D. Atkins; Patent Law Group: Atkins & Associates, P.C.

(57) ABSTRACT

A semiconductor device has an integrated passive device (IPD) formed over a substrate. The IPD can be a metal-insulator-metal capacitor or an inductor formed as a coiled conductive layer. A signal interconnect structure is formed over the first side or backside of the substrate. The signal interconnect structure is electrically connected to the IPD. A thin film ZnO layer is formed over the substrate as a part of an electrostatic discharge (ESD) protection structure. The thin film ZnO layer has a non-linear resistance as a function of a voltage applied to the layer. A conductive layer is formed over the substrate. The thin film ZnO layer is electrically connected between the signal interconnect structure and conductive layer to provide an ESD path to protect the IPD from an ESD transient. A ground interconnect structure is formed over the substrate and electrically connects the conductive layer to a ground point.

26 Claims, 6 Drawing Sheets

SEMICONDUCTOR DEVICE AND METHOD OF PROVIDING ELECTROSTATIC DISCHARGE PROTECTION FOR INTEGRATED PASSIVE DEVICES

CLAIM TO DOMESTIC PRIORITY

The present application is a division of U.S. patent application Ser. No. 12/167,146, now U.S. Pat. No. 7,772,080, filed Jul. 2, 2008, and claims priority to the foregoing parent application pursuant to 35 U.S.C. §121.

FIELD OF THE INVENTION

The present invention relates in general to semiconductor devices and, more particularly, to a semiconductor device having an electrostatic discharge protection structure for integrated passive devices.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

Semiconductor devices are known to be susceptible to damage from electrostatic discharge (ESD). When electrostatic charges accumulate on a human body, a high static potential is formed with respect to ground. If the human body touches or comes in close proximity to any part of the IC, the static potential can discharge through the IC and inject large currents which can damage the active and passive circuits on the IC. If the breakdown voltage of the semiconductor device is exceeded, then the IC can be rendered defective well before its useful life expectancy.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

One semiconductor design goal is to provide IPDs that have expanded electrical properties, such as greater capacitance or inductance. The classic capacitor has two electrode plates separated by an intermediate dielectric material. The capacitance of an IPD is a function of the area of the electrode plates, type of intermediate dielectric material, and thickness of the dielectric material. In the case of capacitor sensitivity to ESD, the breakdown voltage is a function of the thickness and strength of dielectric material. While reducing the thickness of the dielectric thin film has the advantage of increasing capacitance density and reducing the size of the capacitor, the thinner dielectric makes the capacitor more susceptible to damage from an ESD transient event. If ESD energy is discharged across an unprotected thin film capacitor, the device can be damaged.

SUMMARY OF THE INVENTION

A need exists to protect IPDs from an ESD transient. Accordingly, in one embodiment, the present invention is a semiconductor device comprising a substrate and IPD formed over a first side of the substrate. An interconnect structure is formed over the substrate and IPD. The interconnect structure is electrically connected to the IPD. A thin film layer is formed over the first side of the substrate. The thin film layer has electrical characteristics of a varistor. A first conductive layer is formed over the first side of the substrate. The thin film layer is electrically connected between the interconnect structure and first conductive layer to provide an ESD path to protect the IPD from an ESD transient.

In another embodiment, the present invention is a semiconductor device comprising a substrate and IPD formed over a first surface of the substrate. An interconnect structure is formed over the substrate and electrically connected to the IPD. An ESD protection structure is formed over the substrate. The ESD protection structure includes a resistive layer having a resistance value as a function of a voltage applied to the resistive layer. A first conductive layer is formed over the substrate. The resistive layer is electrically connected between the interconnect structure and first conductive layer to provide an ESD path to protect the IPD from an ESD transient.

In another embodiment, the present invention is a semiconductor device comprising a substrate and circuit structure formed over the substrate. The circuit structure is susceptible to an ESD transient. An interconnect structure is formed over the substrate and electrically connected to the circuit structure. A varistor is formed over the substrate. A first conductive layer is formed over the substrate. The varistor is electrically connected between the interconnect structure and first conductive layer to provide an ESD path to protect the circuit structure from the ESD transient.

In another embodiment, the present invention is a semiconductor device comprising a substrate having an IPD formed over the substrate. An interconnect structure is formed over the substrate and electrically connected to the IPD. A thin film layer is formed over the substrate. A first conductive layer is formed over the substrate. The thin film layer is electrically connected between the interconnect structure and first conductive layer to provide an ESD path to protect the IPD from an ESD transient.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
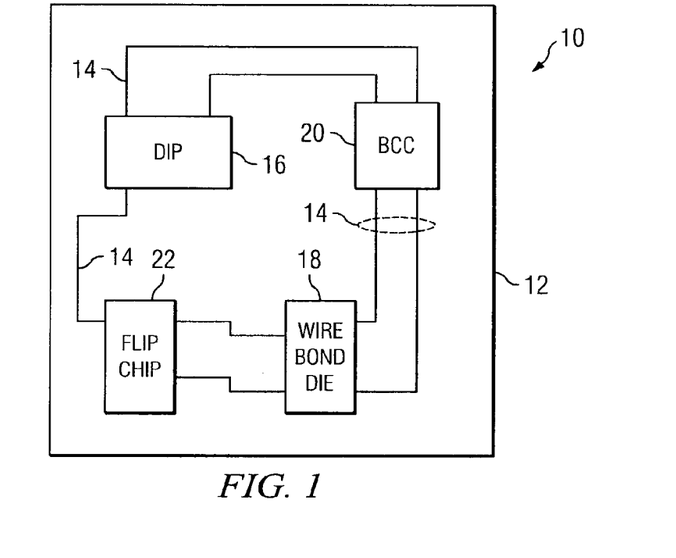
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
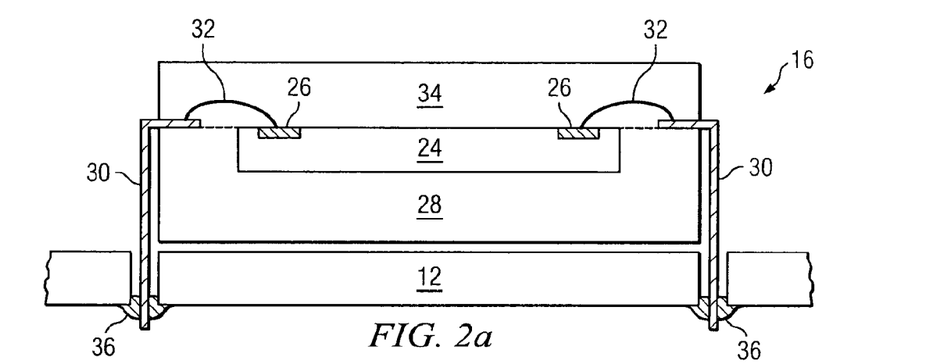
FIGS. 2a-2d illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. An encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
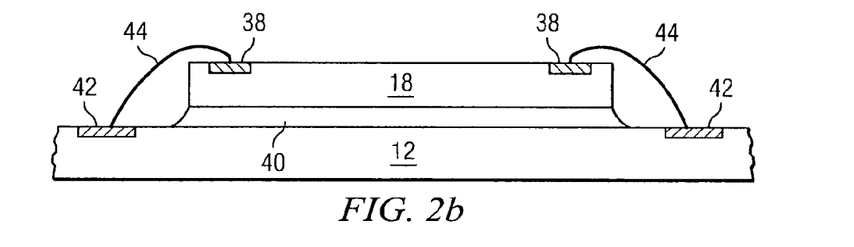

Referring to FIG. 2b, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
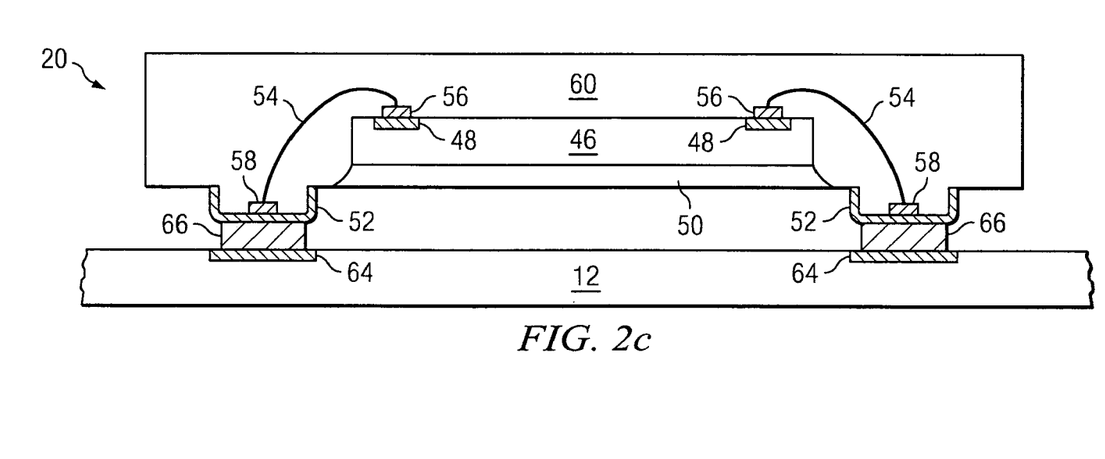

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
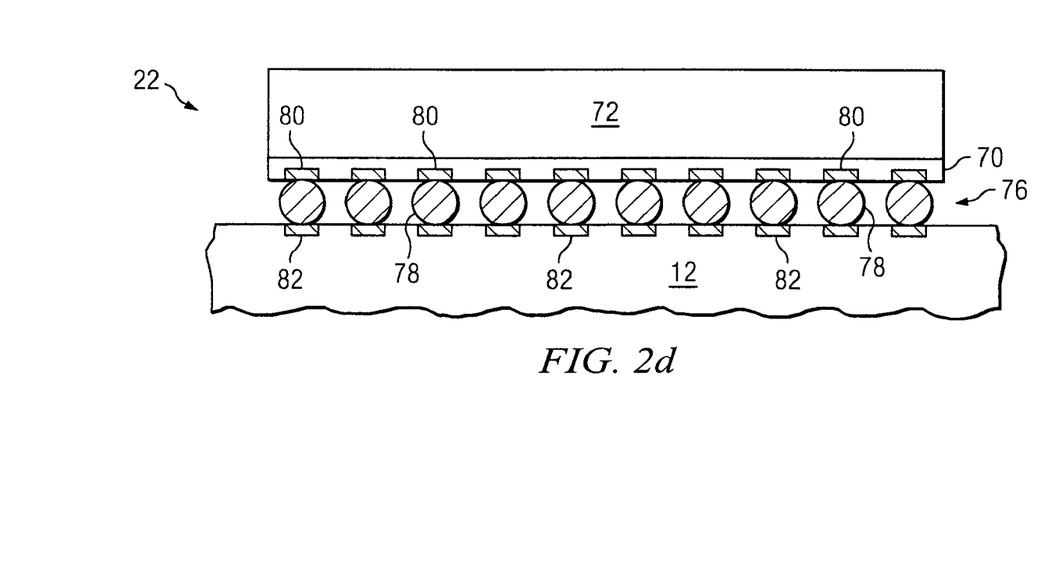

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72, is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
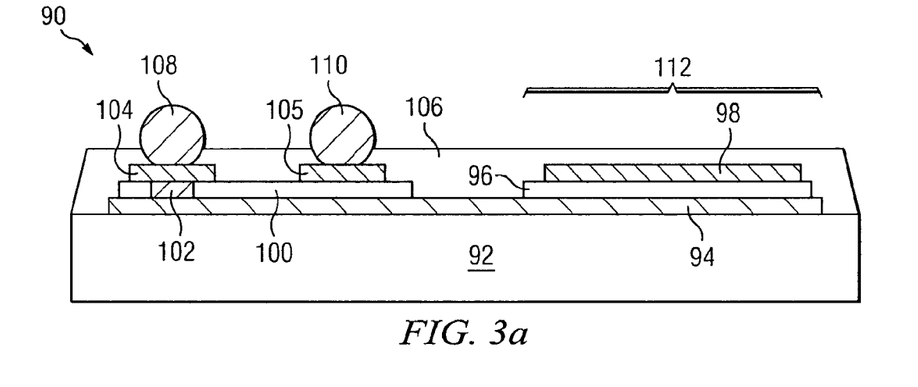
FIGS. 3a-3b illustrate cross-sectional and top views of a semiconductor device with an integrated capacitor and ESD protection structure.

In FIG. 3a, a semiconductor device 90 is shown with substrate 92 which is made with silicon, gallium arsenide, or other bulk semiconductor material for structural support. Substrate 92 has a high resistivity, on the order of 1 k ohms/cm or greater. The surface of substrate 92 can be implanted with oxide to suppress surface conduction.

Semiconductor device 90 contains integrated passive devices (IPD). Examples of the IPDs include resistors, inductors, and capacitors. The IPDs contained within semiconductor device 90 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

The IPDs in semiconductor device 90 may be susceptible to damage from electrostatic discharge (ESD). When electrostatic charges accumulate on a human body, a high static potential is formed with respect to ground. If the human body touches or comes in close proximity to any part of the semiconductor device, the static potential can discharge through the device and inject large currents which can damage the active and passive circuits on the device.

An electrically conductive layer 94 is formed on substrate 92. Conductive layer 94 can be deposited by PVD, CVD, evaporation, electrolytic plating, electroless plating, screen printing, or other suitable metal deposition process. Conductive layer 94 can be Al, Cu, Sn, Ni, Au, Ag, or other suitable electrically conductive material.

An insulating layer 96 is formed on a first region of conductive layer 94. The insulating layer 96 can be silicon dioxide (SiO2), silicon nitride (Si3N4), silicon oxynitride (SiON), tantalum pentoxide (Ta2O5), aluminum oxide (Al2O3), polyimide (PI), or other suitable material having dielectric and insulating properties. In one embodiment, the insulating layer 96 is about 100 to 5000 angstroms in thickness and can be formed by PVD, CVD, sputtering, sintering, or thermal oxidation process.

An electrically conductive layer 98 is formed on insulating layer 96. Conductive layer 98 can be deposited by PVD, CVD, evaporation, electrolytic plating, electroless plating, screen printing, or other suitable metal deposition process. Conductive layer 98 can be Al, Cu, Sn, Ni, Au, Ag, or other suitable electrically conductive material.

A resistive layer 100 is formed on a second region of conductive layer 94, separate from the first region of conductive layer 94. Resistive layer 100 has electrical characteristics of a varistor, i.e., it has a variable or non-linear resistance as a function of the voltage applied across the layer. The resistance of resistive layer 100 changes inversely and non-linearly with the voltage across the layer, i.e., resistance decreases with increasing voltage. In one embodiment, resistive layer 100 has multiple layers of thin film oxide, such as zinc oxide (ZnO), polycrystalline/amorphous silicon, or other material having similar properties. The thin film oxide material gives resistive layer 100 a non-linear current-to-voltage relationship as defined in equation (1).

$$I=(V/C)^\alpha \quad (1)$$

where

I is current through resistive layer

V is voltage across resistive layer

C is constant value determined by the material of the resistive layer

α is non-linear value determined by the material of the resistive layer

In one embodiment, the thin film ZnO can be deposited onto silicon wafers using a wet chemical etching process in 5% NH4Cl in water. The thin film is patterned using photolithography followed by oxygen plasma treatment of the ZnO in a barrel reactor for 30 seconds with a power level of 400 W, and oxygen pressure of 1 Torr. The thin film ZnO film is etched by a solution of 5% NH4Cl in water at a temperature of 55-60° C. The oxygen plasma treatment prior to the wet chemical etch improves the etching uniformity and minimized undercutting.

Alternatively, a reactive ion etching in a SiCl4 plasma can be used to deposit the thin film ZnO. A tri-level masking scheme is used for the delineation of the ZnO thin film. The pattern is transferred into the ZnO layer using the following parameters: substrate temperature of 100-150° C., SiCl4 pressure of ~25 mTorr, and RF power density of 0.34-0.5 W/cm2. After SiCl4 RIE, the thin film ZnO is removed from the etch chamber, washed in de-ionized water, and dried in nitrogen gas to avoid corrosion due to the hydrochloric acid formed by the residual chlorine and water vapor. The remaining masking medium is washed away by oxygen plasma.

A portion of resistive layer 100 is removed by laser drilling or etching to create an opening that extends down to conductive layer 94. An electrically conductive material is deposited into the opening to form conductive via 102 using PVD, CVD, evaporation, electrolytic plating, electroless plating, screen printing, or other suitable metal deposition process. The conductive material can be Al, Cu, Sn, Ni, Au, Ag, or other suitable electrically conductive material.

An electrically conductive layer is patterned and deposited on resistive layer 100 and conductive via 102 as shown in FIG. 3a. The conductive layer provides interconnect sites or contact pads 104 and 105 for formation of interconnect structures such as solder bumps. Conductive layers 104 and 105 can be Al, Cu, Sn, Ni, Au, Ag, or other suitable electrically conductive material. Conductive layers 104 and 105 can be deposited by PVD, CVD, evaporation, electrolytic plating, electroless plating, screen printing, or other suitable metal deposition process.

A passivation layer 106 is deposited over the structure. Passivation layer 106 can be SiO2, Si3N4, SiON, PI, benzocyclobutene (BCB), polybenzoxazole (PBO), or other insulating material. A portion of passivation layer 106 is removed by an etching process to expose contact pads 104 and 105.

An electrically conductive solder material is deposited over contact pads 104 and 105 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 108 and 110. In some applications, solder bumps 108 and 110 are reflowed a second time to improve electrical contact to contact pads 104 and 105.

Figure 3B:
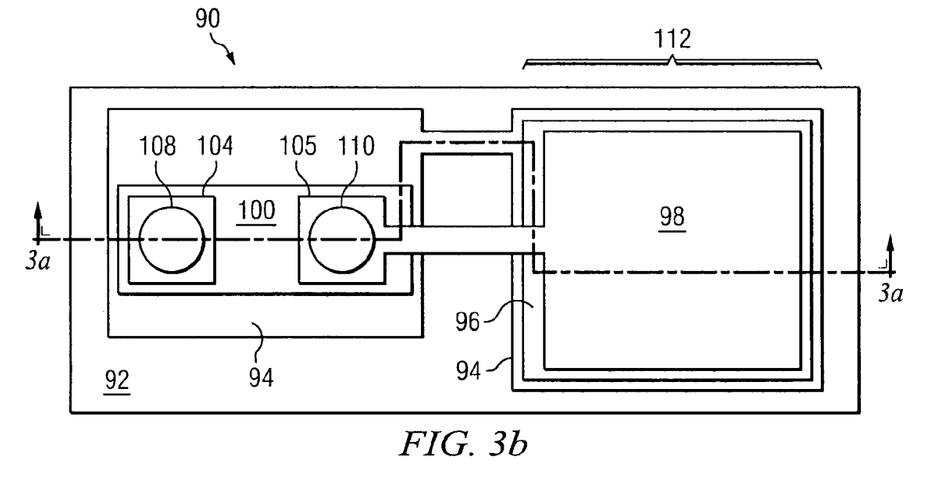

A top view of the semiconductor structure is shown in FIG. 3b. Solder bump 110 is an interconnect structure for electrical signals. Contact pad 105 electrically connects to conductive layer 98. Conductive layer 94 electrically connects through conductive via 102 and contact pad 104 to solder bump 108. Solder bump 108 is a ground interconnect structure to an external low-impedance ground point. Accordingly, conductive layer 94 is a ground plate formed on substrate 92. Bond wires and other interconnect structures can be used in place of, or in addition to, solder bumps 108 and 110.

The combination of conductive layers 94 and 98 with intermediate insulating layer 96 functions as a metal-insulator-metal (MIM) capacitor 112. MIM capacitor 112 represents one type of IPD in semiconductor device 90 which is susceptible to damage from ESD and requires protection. Resistive layer 100, being connected to ground through conductive layer 94, provides the ESD protection for capacitor 112.

Figure 4:
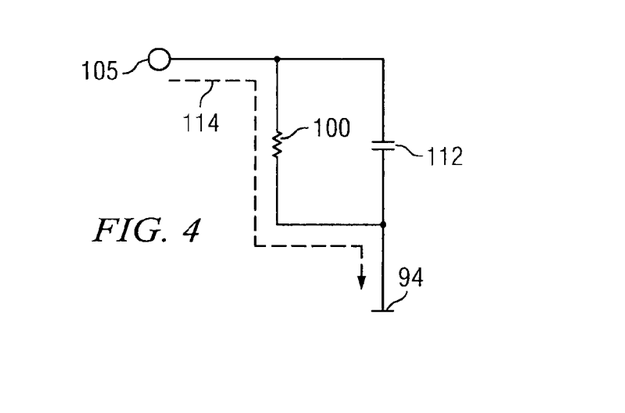
FIG. 4 is a schematic circuit diagram of the integrated capacitor and ESD protection structure.

FIG. 4 shows a schematic representation of a portion of semiconductor device 90. If a high voltage is brought in contact with or in close proximity to contact pad 105, for example in an ESD transient event such as human body containing an electrostatic charge, then the ESD current could discharge through and potentially damage capacitor 112. In the present embodiment, the ESD protection structure provides an ESD path 114 through resistive layer 100 and grounded conductive layer 94 to safely discharge the ESD current and protect capacitor 112.

Figure 5A:
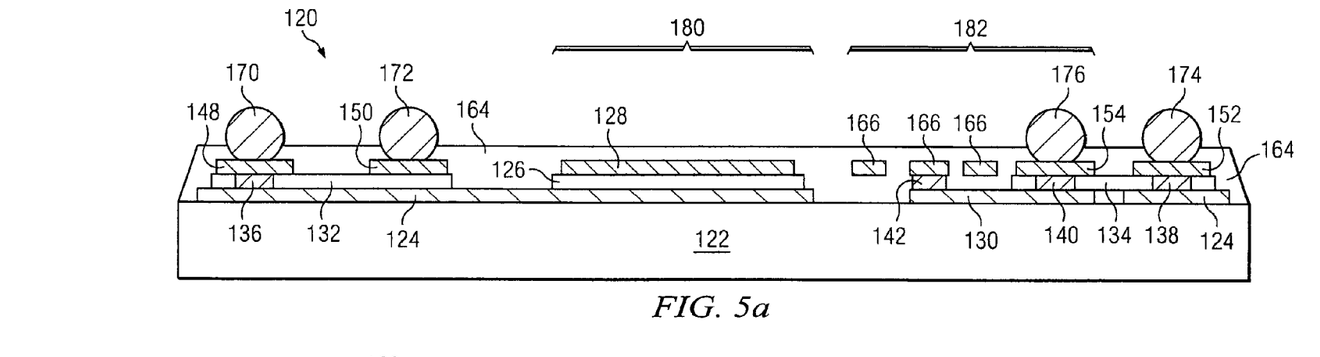
FIGS. 5a-5b illustrate cross-sectional and top views of a semiconductor device with an integrated capacitor and inductor and ESD protection structure.

Another IPD structure with an ESD protection structure is shown in FIG. 5a. A semiconductor device 120 is shown with substrate 122 which is made with silicon, gallium arsenide, or other bulk semiconductor material for structural support. Substrate 122 has a high resistivity, on the order of 1 k ohms/cm or greater. The surface of substrate 122 can be implanted with oxide to suppress surface conduction.

An electrically conductive layer 124 is formed on substrate 122. Conductive layer 124 can be deposited by PVD, CVD, evaporation, electrolytic plating, electroless plating, screen printing, or other suitable metal deposition process. Conductive layer 124 can be Al, Cu, Sn, Ni, Au, Ag, or other suitable electrically conductive material.

An insulating layer 126 is formed on a first region of conductive layer 124. The insulating layer 126 can be SiO2, Si3N4, SiON, Ta2O5, Al2O3, PI, or other suitable material having dielectric and insulating properties. In one embodiment, the insulating layer 126 is about 100 to 5000 angstroms in thickness and can be formed by PVD, CVD, sputtering, sintering, or thermal oxidation process.

An electrically conductive layer 128 is formed on insulating layer 126. Conductive layer 128 can be deposited by PVD, CVD, evaporation, electrolytic plating, electroless plating, screen printing, or other suitable metal deposition process. Conductive layer 128 can be Al, Cu, Sn, Ni, Au, Ag, or other suitable electrically conductive material.

An electrically conductive layer 130 is formed on substrate 122. Conductive layer 130 can be deposited by PVD, CVD, evaporation, electrolytic plating, electroless plating, screen printing, or other suitable metal deposition process. Conductive layer 130 can be Al, Cu, Sn, Ni, Au, Ag, or other suitable electrically conductive material.

A resistive layer 132 is formed on a second region of conductive layer 124, separate from the first region of conductive layer 124. A resistive layer 134 is formed on conductive layer 130 and a third region of conductive layer 124, separate from the first and second regions of conductive layer 124. Resistive layers 132 and 134 have electrical characteristics of a varistor, each having a variable or non-linear resistance as a function of the voltage applied across the layers. The resistance of resistive layers 132 and 134 changes inversely and non-linearly with the voltage across the layers, i.e., resistance decreases with increasing voltage. In one embodiment, resistive layers 132 and 134 have multiple layers of thin film oxide, such as ZnO, polycrystalline/amorphous silicon, or other material having similar properties. The thin film oxide material gives resistive layers 132 and 134 a current-to-voltage relationship as defined in equation (1).

A portion of resistive layers 132 and 134 is removed by laser drilling or etching to create openings that extend down to conductive layer 124 and conductive layer 130. An electrically conductive material is deposited into the openings to form conductive vias 136, 138, and 140 using PVD, CVD, evaporation, electrolytic plating, electroless plating, screen printing, or other suitable metal deposition process. An electrically conductive material 142 is also deposited over conductive layer 130 using PVD, CVD, evaporation, electrolytic plating, electroless plating, screen printing, or other suitable metal deposition process. The conductive material for interconnect structures 136-142 can be Al, Cu, Sn, Ni, Au, Ag, or other suitable electrically conductive material.

An electrically conductive layer is patterned and deposited on resistive layer 132 and conductive vias 136, 138, and 140 as shown in FIG. 5a. The conductive layer provides interconnect sites or contact pads 148, 150, 152, and 154 for formation of interconnect structures such as solder bumps. Conductive layer segments 148-154 can be Al, Cu, Sn, Ni, Au, Ag, or other suitable electrically conductive material. Conductive layer segments 148-154 can be deposited by PVD, CVD, evaporation, electrolytic plating, electroless plating, screen printing, or other suitable metal deposition process.

A passivation layer 164 is deposited over the structure. Passivation layer 164 can be SiO2, Si3N4, SiON, PI, BCB, PBO, or other insulating material. A portion of passivation layer 164 is removed by an etching process to expose contact pads 148-154 and conductive layer 142.

An electrically conductive layer 166 is patterned and deposited on passivation layer 164 and conductive layer 142. Conductive layer 166 operates as a wound or coiled inductor. Conductive layer 166 can be Al, Cu, Sn, Ni, Au, Ag, or other suitable electrically conductive material. Conductive layer 166 can be deposited by PVD, CVD, evaporation, electrolytic plating, electroless plating, screen printing, or other suitable metal deposition process.

An electrically conductive solder material is deposited over contact pads 148-154 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 170, 172, 174, and 176. In some applications, solder bumps 170-176 are reflowed a second time to improve electrical contact to contact pads 148-154, respectively.

Figure 5B:
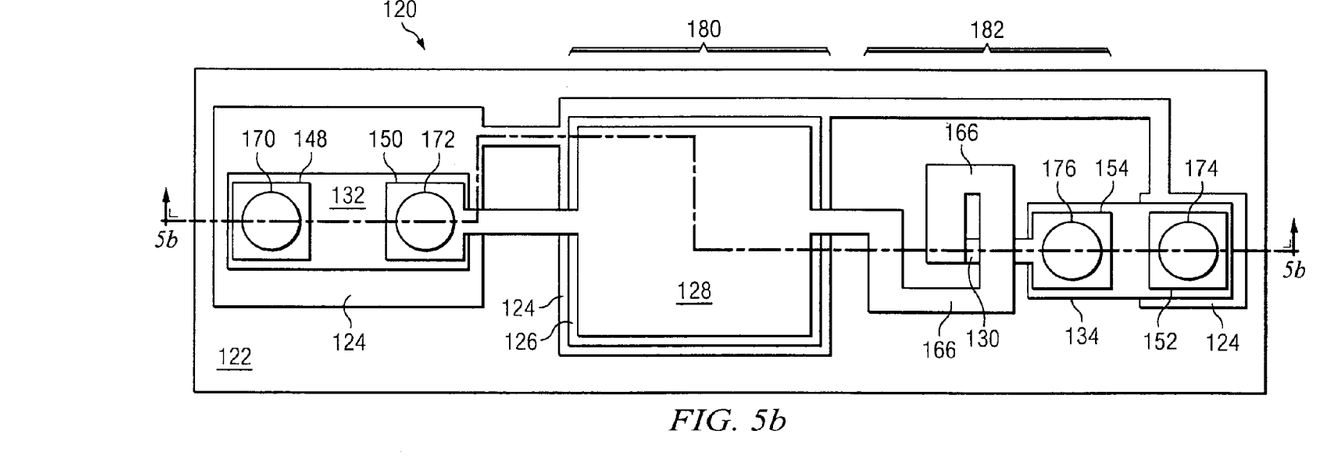

A top view of the semiconductor structure is shown in FIG. 5b. Solder bumps 172 and 176 are interconnect structures for electrical signals. Contact pad 150 electrically connects to conductive layer 128, and contact pad 154 electrically connects to conductive layer 166. Conductive layer 124 electrically connects through conductive via 136 and contact pad 148 to solder bump 170. Solder bump 170 is a ground interconnect structure to an external low-impedance ground point. Likewise, conductive layer 124 electrically connects through conductive via 138 and contact pad 152 to solder bump 174. Solder bump 174 is another ground interconnect structure to the external low-impedance ground point. Accordingly, conductive layer 124 is a ground plate formed on substrate 122. Bond wires and other interconnect structures can be used in place of, or in addition, to solder bumps 170-176.

The combination of conductive layers 124 and 128 with intermediate insulating layer 126 function as a MIM capacitor 180. Conductive layer 166 is a wound or coiled inductor 182 to produce or exhibit the desired inductive properties. A resistor is another type of IPD that can be formed on substrate 122 and electrically connected to MIM capacitor 180 and/or conductive layer 166. MIM capacitor 180 and inductor 182 represents IPDs in semiconductor 120 which are susceptible to damage from ESD and require protection. Resistive layers 132 and 134, being connected to ground through conductive layer 124, provide the ESD protection for capacitor 180 and inductor 182.

Figure 6:
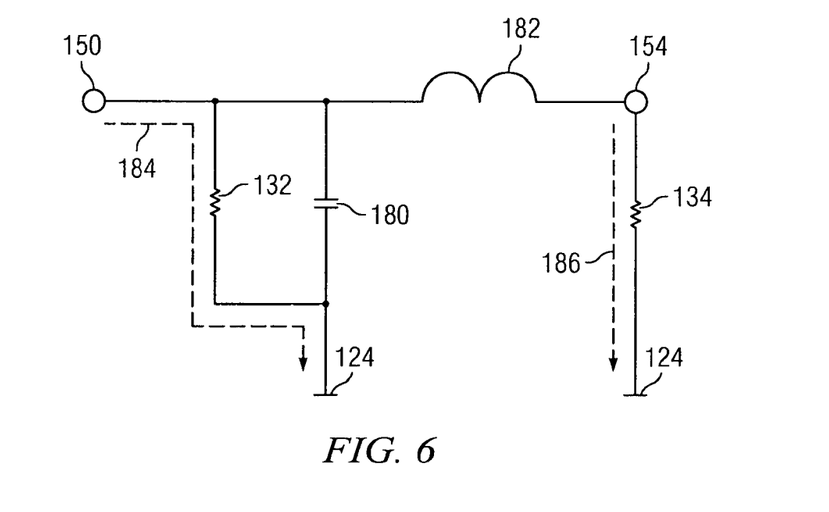
FIG. 6 is a schematic circuit diagram of the integrated capacitor and inductor and ESD protection structure.

FIG. 6 shows a schematic representation of a portion of semiconductor device 120. If a high voltage is impressed on contact pad 150 or contact pad 154, for example in an ESD transient event such as human body containing an electrostatic charge, then the ESD current could discharge through and potentially damage capacitor 180 or inductor 182. In the present embodiment, the ESD protection structure provides an ESD path 184 through resistive layer 132 and grounded conductive layer 124, and ESD path 186 through resistive layer 134 and grounded conductive layer 124, to safely discharge the ESD current and protect capacitor 180 and inductor 182.

Figure 7:
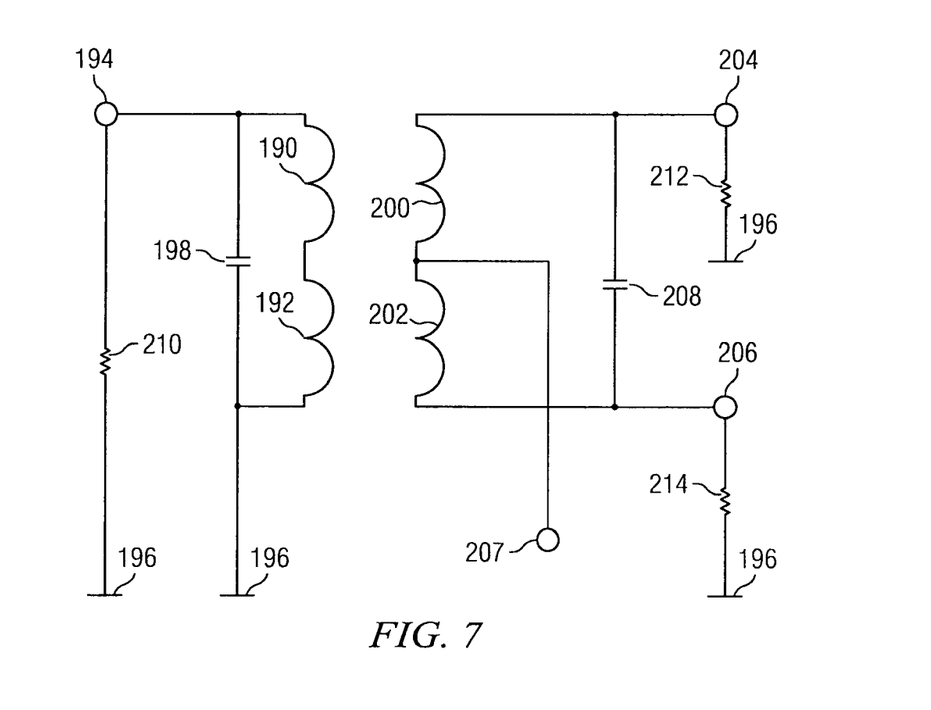
FIG. 7 is a schematic circuit diagram of a balun and ESD protection structure.

FIG. 7 shows ESD protection for a balun. The balun includes inductors 190 and 192 serially coupled between contact pad 194 and ground terminal 196. MIM capacitor 198 is coupled across inductors 190 and 192. The balun also contains inductors 200 and 202 serially coupled between contact pads 204 and 206. MIM capacitor 208 is coupled across inductors 200 and 202. Inductors 190-192 and 200-202 are each configured as described for inductor 180 and arranged on the semiconductor device to create a mutual inductance between inductors 190 and 200 and between inductors 192 and 202. MIM capacitors 198 and 208 are each configured as described for MIM capacitor 180. Varistors 210, 212, and 214 are coupled between contact pads 194, 204, and 206, respectively, and ground terminal 196, similar to resistive layers 132 and 134 in FIGS. 5a-5b.

If a high voltage is impressed on contact pads 194, 204, and/or 206, for example in an ESD transient event from a human body containing an electrostatic charge, then the ESD current could discharge through and potentially damage one or more of capacitors 198 and 208 and inductors 190, 192, 200, and 202. In the present embodiment, the ESD protection structure provides ESD discharge paths through one or more of varistors 210-214 to safely discharge the ESD current and protect the capacitors and inductors.

Figure 8:
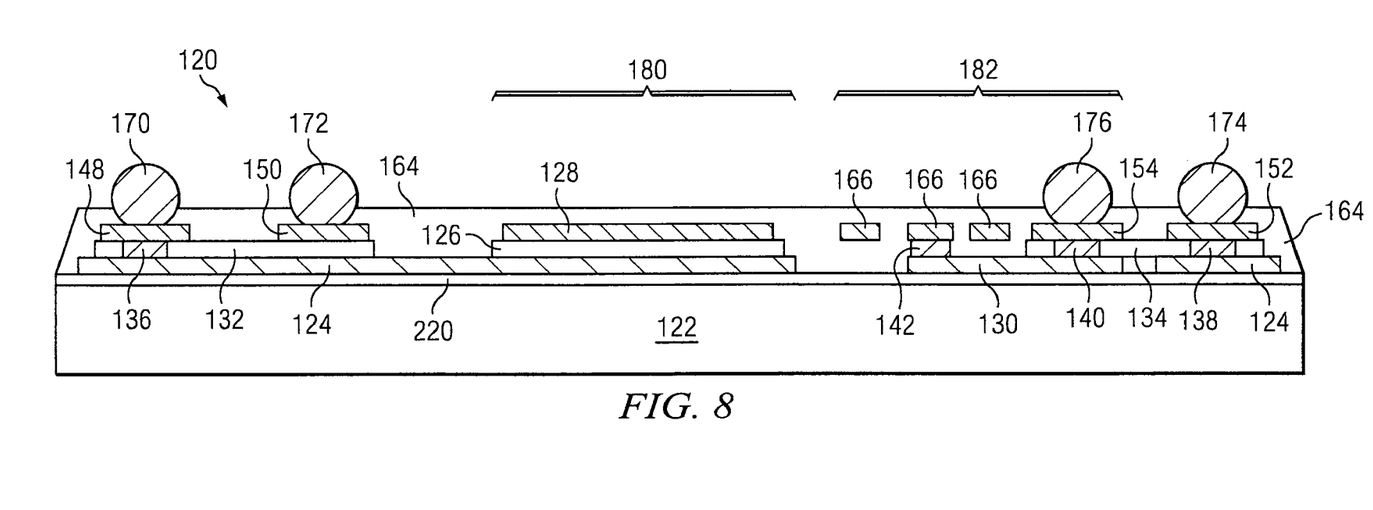
FIG. 8 illustrates a semiconductor device with an insulating layer between substrate and IPDs and ESD protection structure.

FIG. 8 shows an ESD protection structure similar to FIGS. 5a-5b with an insulating layer 220 disposed between substrate 120 and the IPD structures. The insulating layer 220 improves the properties and performance of the IPDs.

Figure 9:
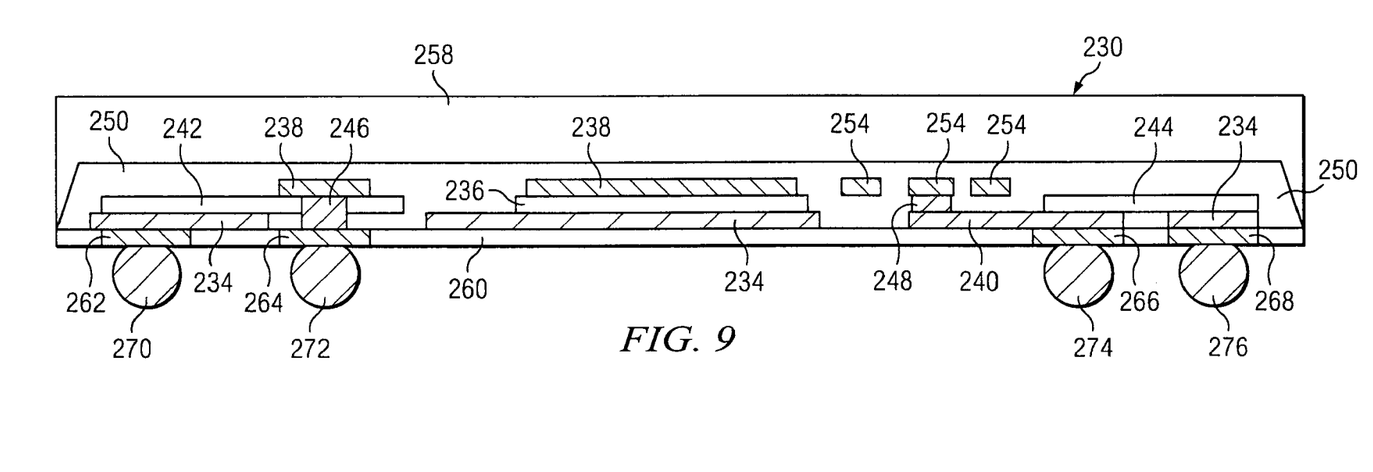
FIG. 9 illustrates a semiconductor device with backside interconnect for IPDs and ESD protection structure.

Another ESD protection circuit for an IPD structure is shown in FIG. 9. Semiconductor device 230 is first formed on a sacrificial substrate or carrier. The sacrificial carrier can be silicon, ceramic, glass, molding compound, or other suitable low-cost, rigid material. An insulating layer is typically formed on the sacrificial substrate.

An electrically conductive layer 234 is formed on the sacrificial substrate. Conductive layer 234 can be deposited by PVD, CVD, evaporation, electrolytic plating, electroless plating, screen printing, or other suitable metal deposition process. Conductive layer 234 can be Al, Cu, Sn, Ni, Au, Ag, or other suitable electrically conductive material.

An insulating layer 236 is formed on a first region of conductive layer 234. The insulating layer 236 can be SiO2, Si3N4, SiON, Ta2O5, Al2O3, PI, or other suitable material having dielectric and insulating properties. In one embodiment, the insulating layer 236 is about 100 to 5000 angstroms in thickness and can be formed by PVD, CVD, sputtering, sintering, or thermal oxidation process.

An electrically conductive layer 238 is formed on insulating layer 236. Conductive layer 238 can be deposited by PVD, CVD, evaporation, electrolytic plating, electroless plating, screen printing, or other suitable metal deposition process. Conductive layer 238 can be Al, Cu, Sn, Ni, Au, Ag, or other suitable electrically conductive material.

An electrically conductive layer 240 is formed on the sacrificial substrate. Conductive layer 240 can be deposited by PVD, CVD, evaporation, electrolytic plating, electroless plating, screen printing, or other suitable metal deposition process. Conductive layer 240 can be Al, Cu, Sn, Ni, Au, Ag, or other suitable electrically conductive material.

A resistive layer 242 is formed on a first region of conductive layer 234. A resistive layer 244 is formed on conductive layer 240 and a second region of conductive layer 234, separate from the first region of conductive layer 234. Resistive layers 242 and 244 have electrical characteristics of a varistor, each having a variable or non-linear resistance as a function of the voltage applied across the layers. The resistance of resistive layers 242 and 244 changes inversely and non-linearly with the voltage across the layers, i.e., resistance decreases with increasing voltage. In one embodiment, resistive layers 242 and 244 have multiple layers of thin film oxide, such as ZnO, polycrystalline/amorphous silicon, or other material having similar properties. The thin film oxide material gives resistive layers 242 and 244 a current-to-voltage relationship as defined in equation (1).

A portion of resistive layer 242 is removed by laser drilling or etching to create an opening that extends down to the sacrificial substrate. An electrically conductive material is deposited into the opening to form conductive via 246 using PVD, CVD, evaporation, electrolytic plating, electroless plating, screen printing, or other suitable metal deposition process. An electrically conductive material 248 is also deposited over conductive layer 240 using PVD, CVD, evaporation, electrolytic plating, electroless plating, screen printing, or other suitable metal deposition process. The conductive material for interconnect structures 246-248 can be Al, Cu, Sn, Ni, Au, Ag, or other suitable electrically conductive material. Conductive layer 238 is also formed over conducive via 246.

A passivation layer 250 is deposited over the structure. Passivation layer 250 can be SiO2, Si3N4, SiON, PI, BCB, PBO, or other insulating material. A portion of passivation layer 250 is removed by an etching process to expose conductive layer 248.

An electrically conductive layer 254 is patterned and deposited on passivation layer 250 and conductive layer 248. Conductive layer 254 operates as a wound or coiled inductor. Conductive layer 254 can be Al, Cu, Sn, Ni, Au, Ag, or other suitable electrically conductive material. Conductive layer 254 can be deposited by PVD, CVD, evaporation, electrolytic plating, electroless plating, screen printing, or other suitable metal deposition process. Another passivation layer 250 is deposited over conductive layer 254. Conductive layer 254 operates as a wound or coiled inductor. Conductive layer 254 can be Al, Cu, Sn, Ni, Au, Ag, or other suitable electrically conductive material. Conductive layer 254 can be deposited by PVD, CVD, evaporation, electrolytic plating, electroless plating, screen printing, or other suitable metal deposition process A rigid, high resistivity molding compound or encapsulant 258 is deposited over passivation layer 250. Molding compound 258 can be epoxy acrylate or other polymer material and applied by transfer molding, liquid encapsulant molding, or other molding process. Molding compound 258 is non-conductive and environmentally protects the semiconductor device from external elements and contaminants.

The sacrificial substrate is removed to expose conductive layer 234 and passivation layer 250. An interconnect structure is formed on a backside of the semiconductor device. An insulating layer 260 is first deposited and then etched to expose conductive layer 234, conductive layer 246, and conductive layer 240. An electrically conductive layer is patterned and deposited on conductive layers 234, 246, and 240 as shown in FIG. 9. The conductive layer provides interconnect sites or contact pads 262, 264, 266, and 268 for formation of interconnect structures such as solder bumps. Conductive layer segments 262-268 can be Al, Cu, Sn, Ni, Au, Ag, or other suitable electrically conductive material. Conductive layer segments 262-268 can be deposited by PVD, CVD, evaporation, electrolytic plating, electroless plating, screen printing, or other suitable metal deposition process.

An electrically conductive solder material is deposited over contact pads 262-268 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 270, 272, 274, and 276. In some applications, solder bumps 270-276 are reflowed a second time to improve electrical contact to contact pads 262-268, respectively.

Solder bumps 272 and 274 are interconnect structures for electrical signals. Contact pad 264 electrically connects to conductive layer 238, and contact pad 266 electrically connects to conductive layer 254. Conductive layer 234 electrically connects through contact pad 262 to solder bump 270. Solder bump 270 is a ground interconnect structure to an external low-impedance ground point. Likewise, conductive layer 234 electrically connects through contact pad 268 to solder bump 276. Solder bump 276 is another ground interconnect structure to the external low-impedance ground point. Accordingly, conductive layer 234 is a ground plate formed on insulating layer 260. Bond wires and other interconnect structures can be used in place of, or in addition, to solder bumps 270-276.

The combination of conductive layers 234 and 238 with intermediate insulating layer 236 function as a MIM capacitor. Conductive layer 254 is a wound or coiled inductor to produce or exhibit the desired inductive properties. The MIM capacitor and inductor represents IPDs in semiconductor 230 which are susceptible to damage from ESD and require protection. Resistive layers 242 and 244, being connected to ground through conductive layer 234, provide the ESD protection structure for the IPDs.

The schematic representation of the IPDs and ESD protection structure is similar to FIG. 6. If a high voltage is impressed on contact pad 264 or contact pad 266, for example in an ESD transient event such as human body containing an electrostatic charge, then the ESD current could discharge through and potentially damage the MIM capacitor and/or coiled inductor. In the present embodiment, the ESD protection structure provides an ESD path through resistive layer 242 and grounded conductive layer 234, and an ESD path through resistive layer 244 and grounded conductive layer 234, to safely discharge the ESD current and protect the IPDs.

The ESD protection structure can be used with other active and passive circuits susceptible to ESD transients. The ESD protection structure is coupled to the signal interconnect structure of the device to be protected. The ESD protection structure has one or more resistive layers (thin film ZnO) exhibiting a non-linear resistance as a function of the voltage applied across the layers. The ESD protection structure provides an ESD path through the resistive layer and ground terminal to safely discharge the ESD current and protect the circuit.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a substrate;
    an integrated passive device (IPD) formed over a surface of the substrate, the IPD including a capacitor;
    a conductive layer formed over the surface of the substrate and electrically connected to the IPD;
    a thin film layer formed over a surface of the conductive layer, the thin film layer including electrical characteristics of a varistor; and
    an interconnect structure formed over a surface of the thin film layer opposite the conductive layer to provide an electrostatic discharge (ESD) path to protect the IPD from an ESD transient.

2. The semiconductor device of claim 1, wherein the thin film layer includes metal oxide or polycrystalline/amorphous silicon.

3. The semiconductor device of claim 1, wherein the thin film layer includes zinc oxide.

4. The semiconductor device of claim 1, wherein the thin film layer has a resistance value as a function of a voltage applied to the thin film layer.

5. The semiconductor device of claim 1, wherein the IPD further includes an inductor or resistor.

6. The semiconductor device of claim 1, further including a ground interconnect structure formed over the surface of the substrate, the ground interconnect structure being a low-impedance ground point electrically connected to the conductive layer.

7. A semiconductor device, comprising:
    a substrate;
    an integrated passive device (IPD) susceptible to an electrostatic discharge (ESD) transient and formed over a surface of the substrate;
    a first conductive layer formed over the surface of the substrate and electrically connected to the IPD;
    an ESD protection structure formed over a surface of the first conductive layer
    a first insulating layer formed over the ESD protection structure, IPD, and surface of the substrate; and
    a bump or bond wire formed over a surface of the ESD protection structure opposite the first conductive layer and partially exposed from the first insulating layer to provide an ESD path to protect the IPD from the ESD transient.

8. The semiconductor device of claim 7, wherein the IPD includes a capacitor, resistor, or inductor.

9. The semiconductor device of claim 7, wherein the IPD includes:
    a portion of the first conductive layer formed over the surface of the substrate;
    a second insulating layer formed over the portion of the first conductive layer; and
    a second conductive layer formed over the second insulating layer.

10. The semiconductor device of claim 7, further including an insulating layer formed between the substrate and IPD.

11. The semiconductor device of claim 7, further including a ground interconnect structure formed over the substrate and electrically connected to the first conductive layer.

12. The semiconductor device of claim 7, wherein the ESD protection structure includes a varistor.

13. A semiconductor device, comprising:
    a substrate;
    a circuit structure formed over a surface of the substrate, the circuit structure being susceptible to an electrostatic discharge (ESD) transient;
    a first conductive layer formed over the surface of the substrate and electrically connected to the circuit structure;
    a varistor formed over a surface of the first conductive layer;
    a first insulating layer formed over the varistor and circuit structure; and
    an interconnect structure formed over a surface of the varistor opposite the first conductive layer and partially exposed from the first insulating layer to provide an ESD path to protect the circuit structure from the ESD transient.

14. The semiconductor device of claim 13, wherein the varistor has a non-linear resistance as a function of a voltage applied to the varistor.

15. The semiconductor device of claim 13, wherein the circuit structure is an integrated passive device (IPD).

16. The semiconductor device of claim 15, wherein the IPD includes a capacitor, inductor, or resistor.

17. The semiconductor device of claim 13, wherein the circuit structure includes:
    a portion of the first conductive layer formed over the surface of the substrate;
    a second insulating layer formed over the portion of the first conductive layer; and
    a second conductive layer formed over the second insulating layer.

18. The semiconductor device of claim 13, wherein the circuit structure includes a second conductive layer formed over the surface of the substrate, the second conductive layer being coiled to exhibit an inductive property.

19. The semiconductor device of claim 13, further including a ground interconnect structure formed over the substrate and electrically connected to the first conductive layer.

20. The semiconductor device of claim 13, wherein the interconnect structure includes a bump or bond wire.

21. A semiconductor device, comprising:
    a substrate;
    an integrated passive device (IPD) susceptible to an electrostatic discharge (ESD) transient and formed over a surface of the substrate;
    a conductive layer formed over the surface of the substrate and electrically connected to the IPD;
    a thin film layer formed over a surface of the conductive layer, wherein the thin film layer has a non-linear resistance as a function of a voltage applied to the thin film layer; and an interconnect structure formed over a surface of the thin film layer opposite the conductive layer and partially exposed to provide an ESD path to protect the IPD from an ESD transient.

22. The semiconductor device of claim 21, wherein the IPD includes a capacitor, resistor, or inductor.

23. The semiconductor device of claim 21, further including a ground interconnect structure formed over the substrate and electrically connected to the conductive layer.

24. The semiconductor device of claim 21, wherein the thin film layer includes metal oxide or polycrystalline/amorphous silicon.

25. A semiconductor device, comprising:
a substrate including an integrated passive device (IPD) susceptible to an electrostatic discharge (ESD) transient and formed over the substrate;
an interconnect structure formed over the substrate and electrically connected to the IPD;
a thin film layer formed over the substrate; and
a first conductive layer formed over the substrate, the thin film layer being electrically connected between the interconnect structure and first conductive layer to provide an ESD path to protect the IPD from the ESD transient;
wherein the IPD includes:
an insulating layer formed over the first conductive layer;
a second conductive layer formed over the insulating layer; and
a third conductive layer formed over the substrate, the third conductive layer being coiled to exhibit inductive properties.

26. A semiconductor device, comprising:
a substrate;
an integrated passive device (IPD) susceptible to an electrostatic discharge (ESD) transient and formed over a surface of the substrate;
a conductive layer formed over the surface of the substrate and electrically connected to the IPD;
a thin film layer formed over a surface of the conductive layer; and
an interconnect structure formed over a surface of the thin film layer opposite the conductive layer and partially exposed to provide an ESD path to protect the IPD from an ESD transient, wherein the interconnect structure includes a bump or bond wire.

* * * * *